(12) United States Patent
Fujisawa et al.

(10) Patent No.: US 8,574,532 B2
(45) Date of Patent: Nov. 5, 2013

(54) METHOD FOR PRODUCING SEMICONDUCTOR CRYSTAL, APPARATUS FOR CRYSTAL PRODUCTION AND GROUP 13 ELEMENT NITRIDE SEMICONDUCTOR CRYSTAL

(75) Inventors: Hideo Fujisawa, Ushiku (JP); Yutaka Mikawa, Ushiku (JP)

(73) Assignee: Mitsubishi Chemical Corporation, Tokyo (JP)

(*) Notice: Subject to any disclaimer, the term of this patent is extended or adjusted under 35 U.S.C. 154(b) by 0 days.

(21) Appl. No.: 13/337,592

(22) Filed: Dec. 27, 2011

(65) Prior Publication Data

US 2012/0164057 A1    Jun. 28, 2012

Related U.S. Application Data

(60) Provisional application No. 61/427,403, filed on Dec. 27, 2010.

(51) Int. Cl.
*C01F 1/00*    (2006.01)
*C01B 21/06*   (2006.01)
*C30B 19/00*   (2006.01)

(52) U.S. Cl.
USPC ............ 423/409; 423/111; 117/64; 117/224; 117/71

(58) Field of Classification Search
None
See application file for complete search history.

(56) References Cited

U.S. PATENT DOCUMENTS

| | | | |
|---|---|---|---|
| 6,398,867 B1 | 6/2002 | D'Evelyn et al. | |
| 7,368,015 B2 * | 5/2008 | D'Evelyn et al. | 117/224 |
| 7,803,344 B2 * | 9/2010 | Hashimoto | 423/409 |
| 2006/0037529 A1 * | 2/2006 | D'Evelyn et al. | 117/36 |
| 2008/0102016 A1 * | 5/2008 | Hashimoto | 423/409 |
| 2009/0013926 A1 | 1/2009 | Sasagawa et al. | |

FOREIGN PATENT DOCUMENTS

| | | |
|---|---|---|
| JP | 5-170588 | 7/1993 |
| JP | 2003-511326 | 3/2003 |
| JP | 2004-2152 | 1/2004 |
| JP | 2005-8444 | 1/2005 |
| JP | 2005-289797 | 10/2005 |
| JP | 2006-514581 | 5/2006 |
| JP | 2006-193355 | 7/2006 |
| JP | 2009-40683 | 2/2009 |
| JP | 2010-52967 | 3/2010 |
| JP | 2010-507562 | 3/2010 |
| JP | 2010-189266 | 9/2010 |

OTHER PUBLICATIONS

Zhang et al. Thermodynamic Assessment of the Ga-Pt System; Intermetallics; 14, 826-831; 2006.*
International Search Report issued Mar. 6, 2012 in patent application No. PCT/JP2011/080031 with English translation of Category of Cited Documents.
U.S. Appl. No. 13/481,989, filed May 29, 2012, Mikawa, et al.
International Preliminary Report on Patentability issued Jul. 11, 2013 in PCT/JP11/080031 filed Dec. 26, 2011.

* cited by examiner

*Primary Examiner* — Guinever Gregorio
(74) *Attorney, Agent, or Firm* — Oblon, Spivak, McClelland, Maier & Neustadt, L.L.P.

(57) ABSTRACT

A semiconductor crystal is produced through crystal growth in the presence of a solvent in a supercritical and/or subcritical state in a reactor, wherein at least a part of the surface of the reactor and the surface of the member to be used inside the reactor is coated with a platinum group-Group 13 metal alloy coating film.

11 Claims, 2 Drawing Sheets

Fig. 3

METHOD FOR PRODUCING SEMICONDUCTOR CRYSTAL, APPARATUS FOR CRYSTAL PRODUCTION AND GROUP 13 ELEMENT NITRIDE SEMICONDUCTOR CRYSTAL

CROSS-REFERENCE TO RELATED APPLICATIONS

The present application claims the benefit of U.S. Provisional Patent Application No. 61/427,403, filed Dec. 27, 2010.

BACKGROUND OF THE INVENTION

1. Field of the Invention

The present invention relates to a method for producing a semiconductor crystal and to an apparatus for crystal production. In particular, the method relates to a production method useful for producing a Group 13 element nitride crystal, and to an apparatus for crystal production. The present invention also relates to a Group 13 element nitride semiconductor crystal.

2. Description of the Related Art

An ammonothermal method is a method for producing a desired material using a nitrogen-containing solvent such as an ammonia solvent in a supercritical state and/or a subcritical state and utilizing the dissolution-precipitation reaction of the starting material therein. In the method, when applied to crystal growth, a supersaturation state is generated through the temperature difference based on the temperature dependence of the solubility of the starting material in the solvent such as an ammonia solvent, thereby precipitating a crystal. In a hydrothermal method similar to the ammonothermal method, water in a supercritical and/or subcritical state is used as the solvent for crystal growth, and the method is applied mainly to a crystal of oxide such as quartz ($SiO_2$), zinc oxide (ZnO) or the like. On the other hand, the ammonothermal method is applicable to a nitride crystal, and is utilized for growth of a crystal of nitride such as gallium nitride or the like.

The gallium nitride crystal growth according to the ammonothermal method using, for example, an ammonia solvent as the solvent for the method is a reaction in a supercritical ammonia environment at high temperature and high pressure (500° C. or higher, 150 MPa or more); and it is not easy to plan apparatus resistant to the environment and to select materials resistant thereto. The solubility of gallium nitride in pure ammonia in a supercritical state is extremely low, and therefore for increasing the solubility and promoting the crystal growth, a mineralizer is added to the system. The mineralizer is classified into an acid mineralizer such as typically ammonium halide $NH_4X$ (X=Cl, Br, I) and a basic mineralizer such as typically an alkali amide $XNH_2$ (X=Li, Na, K). The supercritical ammonia environment containing such a mineralizer is an extremely severe corrosive environment. A pressure container (autoclave) can be produced using a material having a strength resistant to the temperature and the pressure (for example, Ni-based superalloy such as Alloy 625, RENE 41, etc.), which, however, could not have complete anticorrosive performance resistant to supercritical ammonia. In particular, the acid mineralizer is highly corrosive to the above-mentioned alloy, therefore requiring establishment of anticorrosive technology using a material having high anticorrosive performance. In case where such an acid mineralizer is used regarding this, a noble metal (platinum, iridium, platinum-iridium alloy), of which the anticorrosiveness has been confirmed, is used as a material for inner lining of autoclaves or as a material for cylindrical reactors (Patent References 1, 2).

CITATION LIST

[Patent References]
  [Patent Reference 1] JP-A 2006-193355
  [Patent Reference 2] JP-T 2006-514581

SUMMARY OF THE INVENTION

Widely known is a method of lining the inner surface of a reactor with a noble metal such as platinum, iridium, platinum-iridium alloy or the like or using a capsule for the purpose of preventing corrosion by supercritical ammonia, as in Patent References 1 and 2. However, the present inventors have found for the first time that even those noble metals that have heretofore been considered to have high corrosion resistance are corroded though slightly and are taken in nitride crystals as impurities therein.

Given that situation, it is necessary to apply a material more stable than those noble metals to reactors and to reduce the impurities in the nitride crystals obtained.

The present inventors have assiduously studied for the purpose of solving the above-mentioned problems and, as a result, have found that, when at least a part of inner surface of the reactor for use for crystal growth and the surface of the member to be used inside the reactor is coated with a platinum group-Group 13 metal alloy to form thereon a platinum group-Group 13 metal alloy coating film, then a nitride crystal can be obtained, in which the impurities heretofore impossible to completely remove are reduced. In addition, the inventors have found that, since the platinum group-Group 13 metal alloy coating film is extremely stable under crystal growth condition, the reactor can be used repeatedly multiple times and is significantly effective for improvement of productivity, and have reached the present invention.

Specifically, the above-mentioned problems can be solved by the production method for semiconductor crystals of the present invention as mentioned below.

[1] A method for producing a semiconductor crystal, which comprises growing a crystal in the presence of a solvent in a supercritical and/or subcritical state in a reactor (crystal growing step), and coating at least a part of the surface of the reactor and the surface of the member to be used inside the reactor with a platinum group-Group 13 metal alloy to form thereon a platinum group-Group 13 metal alloy coating film (film forming step).

[2] A method for producing a semiconductor crystal through crystal growth in the presence of a solvent in a supercritical and/or subcritical state in a reactor, wherein at least a part of the surface of the reactor and the surface of the member to be used inside the reactor is c//oated with a platinum group-Group 13 metal alloy coating film.

[3] The method for producing a semiconductor crystal of [1] or [2], wherein the platinum group-Group 13 metal alloy coating film contains at least Ga as the Group 13 metal.

[4] The method for producing a semiconductor crystal of any one of [1] to [3], wherein the platinum group-Group 13 metal alloy coating film contains at least Pt as the platinum group metal.

[5] The method for producing a semiconductor crystal of any one of [1] to [4], wherein at least 50% of the total area of the inner surface of the reactor and the surface of the member to be used inside the reactor is coated with the platinum group-Group 13 metal alloy coating film.

[6] The method for producing a semiconductor crystal of [1], wherein the platinum group-Group 13 metal alloy coating is carried out simultaneously with at least a part of the crystal growing.

[7] The method for producing a semiconductor crystal of any one of [1] to [6], wherein the platinum group-Group 13 metal alloy coating film is a film that contains at least one alloy selected from a group consisting of $Ga_3Pt_5$, $Ga_3Pt_2$, GaPt, $Ga_2Pt$, $Ga_2Pt$, $GaPt_2$ and $GaPt_3$.

[8] The method for producing a semiconductor crystal of any one of [1] to [7], wherein the platinum group-Group 13 metal alloy coating film has a thickness of from 5 to 100 μm.

[9] The method for producing a semiconductor crystal of [1], wherein the crystal growing and/or the platinum group-Group 13 metal alloy coating is/are carried out multiple times.

[10] The method for producing a semiconductor crystal of any one of [1] to [9], wherein the reactor and the member used inside the reactor are formed of Pt or a Pt-containing alloy.

[11] The method for producing a semiconductor crystal of [1], wherein in the platinum group-Group 13 metal alloy coating, the platinum group-Group 13 metal alloy coating film is formed in the reactor in the presence of a solvent in a supercritical and/or subcritical state and a Group 13 metal therein, at a temperature of from 400 to 700° C. and under a pressure of from 100 to 700 MPa.

[12] The method for producing a semiconductor crystal of any one of [1] to [11], wherein the platinum group-Group 13 metal alloy coating film is polycrystalline.

[13] A crystal production apparatus comprising a reactor for crystal growth in a supercritical ammonia atmosphere in a pressure container, wherein at least a part of the inner surface of the reactor and the surface of the member to be used inside the reactor is coated with a platinum group-Group 13 metal alloy coating film.

[14] The crystal production apparatus of [13], wherein the reactor is a capsule formed of a platinum group metal or a platinum group metal-containing alloy.

[15] The crystal production apparatus of [13], wherein the reactor is a capsule formed of an alloy containing a Pt—Ir alloy.

[16] The crystal production apparatus of any one of [13] to [15], wherein the pressure container has an inner wall lined with a platinum group metal or a platinum group metal-containing alloy.

[17] The crystal production apparatus of any one of [13] to [16], wherein the platinum group-Group 13 metal alloy coating film exists in an amount of at least 50% of the total area of the inner surface of the reactor and the surface of the member to be used inside the reactor.

[18] The crystal production apparatus of any one of [13] to [17], wherein the platinum group-Group 13 metal alloy coating film contains at least Ga as the Group 13 metal therein.

[19] The crystal production apparatus of any one of [13] to [18], wherein the platinum group-Group 13 metal alloy coating film contains at least Pt as the platinum group metal.

[20] The crystal production apparatus of any one of [13] to [19], wherein the platinum group-Group 13 metal alloy coating film is a coating film containing at least one alloy selected from a group consisting of $Ga_3Pt_5$, $Ga_3Pt_2$, GaPt, $Ga_2Pt$, $Ga_2Pt$, $GaPt_2$ and $GaPt_3$.

[21] The crystal production apparatus of any one of [13] to [20], wherein the thickness of the platinum group-Group 13 metal alloy coating film is from 5 to 100 μm.

[22] The crystal production apparatus of any one of [13] to [21], wherein the reactor and the member to be used inside the reactor are formed of Pt or a Pt-containing alloy.

[23] The crystal production apparatus of any one of [13] to [22], wherein the platinum group-Group 13 metal alloy coating film is polycrystalline.

[24] A Group 13 element nitride semiconductor crystal grown in the presence of a solvent in a supercritical and/or subcritical state, in which the concentration of the platinum group metal element contained therein as an impurity is at most 10 times the concentration thereof in the Group 13 element nitride semiconductor crystal grown in the absence of a platinum group metal.

According to the production method of the invention, a nitride crystal can be obtained, in which the impurities heretofore impossible to completely remove are reduced. In addition, since the platinum group-Group 13 metal alloy coating film is extremely stable under crystal growth condition, the reactor can be used repeatedly multiple times and is significantly effective for improvement of productivity.

Further, since the nitride crystal of the invention is uniform and has high quality, and is therefore useful as a semiconductor crystal or the like for light-emitting devices and electronic devices.

BRIEF DESCRIPTION OF DRAWINGS

In the drawings, 1 is autoclave, 2 is inner surface of autoclave, 3 is lining, 4 is inner surface of lining, 5 is baffle plate, 6 is crystal growing region, 7 is seed crystal, 8 is starting material, 9 is starting material melting region, 10 is valve, 11 is vacuum pump, 12 is ammonia cylinder, 13 is nitrogen cylinder, 14 is mass flow meter, 20 is capsule, 21 is inner surface of capsule, 100 is reactor, 101 is carrier gas duct, 102 is carrier gas duct, 103 is Group 13 element starting material duct, 104 is nitrogen starting material duct, 105 is HCl gas duct, 106 is Group 13 Element Starting Material Reservoir, 107 is heater, 108 is susceptor, 109 is exhaust pipe, g1 is carrier gas, g2 is carrier gas, G3 is Group 13 element starting material gas, g4 is nitrogen starting material gas, and G5 is HCl Gas.

Modes For Carrying Out The Invention

The method for producing a semiconductor crystal of the invention, and the crystal production apparatus of the invention and the members thereof to be used for the method are described below. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

The first aspect of the method for producing a semiconductor crystal of the invention comprises a crystal growing step for crystal growth in the presence of a solvent in a supercritical and/or subcritical state in a reactor, and a film forming step of coating at least a part of the inner surface of the reactor and the surface of the member to be used inside the reactor with a platinum group-Group 13 metal alloy to form thereon a platinum group-Group 13 metal alloy coating film. The method may be good to have at least these two steps, in which the steps may be carried out separately and sequentially, or may be carried out simultaneously at the same time. In the production method for a semiconductor crystal, it is good that, in at least apart of the crystal growing step, the film forming step is carried out simultaneously with the crystal growing step, for shortening the time for the entire process. The crystal growing step and/or the film forming step may be carried out multiple times. Even when the crystal growing step and/or the film forming step is/are carried out multiple times, the platinum group-Group 13 metal alloy coating film formed on at least a part of the inner surface of the reactor and the surface of the member to be used inside the reactor exists stably, and therefore the reactor and/or the member can be used for a long period of time, not being corroded, and the productivity can be thereby significantly improved.

The second aspect of the method for producing a semiconductor crystal of the invention is a method for producing a semiconductor crystal through crystal growth in the presence of a solvent in a supercritical and/or subcritical state in a reactor, wherein at least a part of the surface of the reactor and the surface of the member to be used inside the reactor is coated with a platinum group-Group 13 metal alloy coating film.

The production method of the invention is a method for producing a desired material using a nitrogen-containing solvent such as an ammonia solvent in a supercritical state and/or a subcritical state and utilizing the dissolution-precipitation reaction of the starting material therein, and is generally referred to as an ammonothermal method (hereinafter the method may be referred to as an ammonothermal method). Concretely, in the method when applied to crystal growth, a supersaturation state is generated through the temperature difference derived from the temperature dependence of the solubility of the starting material in the solvent such as an ammonia solvent, and a crystal is thereby precipitated.

Not specifically defined, the semiconductor crystal to be obtained in the production method of the invention is includes oxide semiconductor crystals, nitride semiconductor crystals, etc.; and preferred are metal nitride crystals with a Group 13 element in the Periodic Table such as B, Al, Ga, In, etc. The Group 13 metal nitride crystal include GaN, AlN, InN, etc, also including alloy nitride crystals of GaInN, GaAlN, etc. Of those, the invention is especially favorable for obtaining Ga-containing metal nitride crystals.

(Crystal Production Apparatus)

The method of the invention is carried out, using a crystal production apparatus at least equipped with a reactor for crystal growth in the presence of a solvent in a supercritical and/or subcritical state such as in a supercritical ammonia atmosphere in a pressure container. At least a part of the inner surface of the reactor and the surface of the member to be used inside the reactor is coated with a platinum group-Group 13 metal alloy coating film. The details of the platinum group-Group 13 metal alloy coating film are described in the section of the film forming step to be given hereinunder.

(Reactor)

The "reactor" means a container in which a nitride crystal is produced in such a state that a solvent in a supercritical and/or subcritical state is directly kept in contact with the inner wall thereof, and preferred examples thereof include the inside structure of a pressure container itself, a capsule to be installed in a pressure container, etc.

The reactor may be selected from those resistant to high-temperature high-pressure conditions in growth of nitride crystals. The reactor may be one equipped with a mechanism of controlling the pressure to be applied to the reactor and to the contents thereof from the outside, as described in JP-T 2003-511326 (WO01/024921) and JP-T 2007-509507 (WO2005/043638), or may be an autoclave or the like not equipped with such a mechanism.

The pressure container for use in the invention is selected from those resistant to high-temperature high-pressure conditions in growing nitride crystals according to an ammonothermal method. Preferred are those formed of a material having high strength at high temperatures and having corrosion resistance; and especially preferred are those formed of an Ni-based alloy excellent in corrosion resistance to solvents such as ammonia, etc., or a Co-based alloy such as Stellite (trademark of Deloro Stellite Company Incorporated), etc. More preferred are Ni-based alloys, concretely Inconel 625 (Inconel is a trademark of Huntington Alloys Canada Limited—the same shall apply hereinunder), Nimonic 90 (Nimonic is a trademark of Special Metals Wiggin Limited—the same shall apply hereinunder), RENE 41 (trademark of Teledyne Allvac, Inc.), Inconel 718 (Inconel is a trademark of Huntington Alloys Canada Limited—the same shall apply), Hastelloy (trademark of Haynes International, Inc.), Waspaloy (trademark of United Technologies, Inc.), etc.

The alloying ratio of these alloys may be suitably selected depending on the temperature of the solvent in the system, the pressure condition, and other conditions of the reactivity and/or the oxidizing power, the reducing power and the pH of the mineralizing agent and the reaction product thereof contained in the system. Even though high, the corrosion resistance of the alloys for use for the pressure container could not be so high as to have no influence at all on the crystal quality. In a supercritical solvent atmosphere, especially in a severer corrosive atmosphere containing a mineralizing agent therein, the alloys may release the ingredients thereof such as Ni, Cr, Fe or the like in a solution, and the thus-released ingredients may be taken in crystals. Accordingly, in the invention, for preventing the inner surface corrosion of the pressure container, preferably, the reactor is formed according to a method of directly lining or coating the inner surface of the pressure container with a material having more excellent corrosion resistance, or according to a method of installing a capsule formed of a material having more excellent corrosion resistance inside the pressure container.

The material to constitute the reactor includes platinum group metals and noble metals; and concretely there may be mentioned ruthenium (Ru), rhodium (Rh), palladium (Pd), osmium (Os), iridium (Ir), platinum (Pt), gold (Au), silver (Ag). These materials may be used here either singly or as combined as alloys. Not detracting from the effect of the invention, the material to constitute the reactor may contain any other metal. Preferred is use of a platinum group metal or a platinum group metal-containing alloy having excellent corrosion resistance. More preferred is use of Pt or a Pt-containing alloy; and even more preferred is use of Pt or a Pt—Ir alloy.

The configuration to constitute the reactor is not specifically defined. In the method of directly lining or coating the inner surface of a pressure container, it is difficult to line or coat the entire inner surface of the reactor that may be kept in contact with ammonia solvent, and therefore, the method of installing a capsule formed of a material having excellent corrosion resistance is a more preferred embodiment.

The shape of the reactor may be any one, including a cylindrical shape, etc. The reactor may be installed vertically or horizontally, or may also be installed obliquely.

Figure 1:
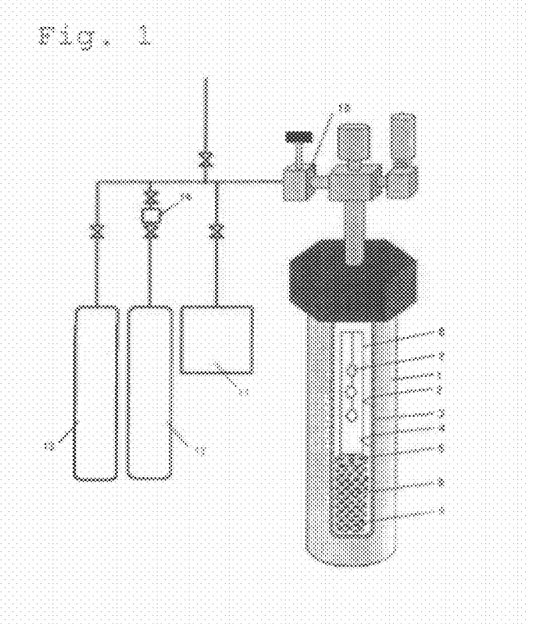
FIG. 1 is a graphical view of one embodiment of the crystal production apparatus of the invention.
Figure 2:
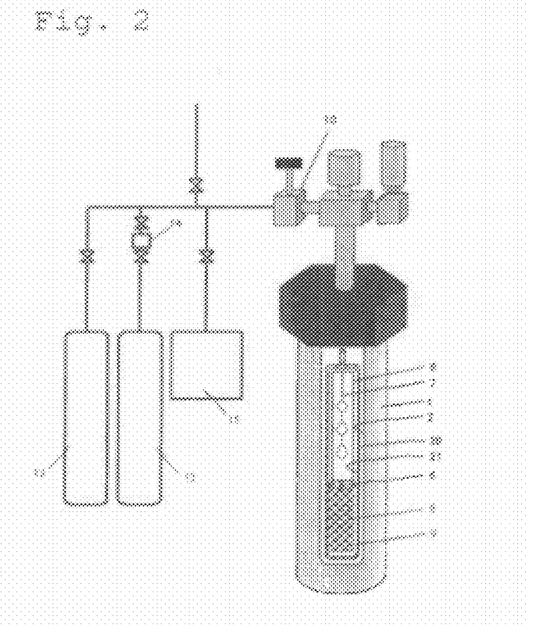
FIG. 2 is a graphical view of another embodiment of the crystal production apparatus of the invention.

Embodiments of the crystal production apparatus including a reactor usable in the production method of the invention are shown in FIG. 1 and FIG. 2. FIGS. 1 and 2 each are a graphical view of the crystal production apparatus usable in the invention. In the crystal production apparatus shown in FIG. 1, crystals are grown in the reactor of a pressure chamber, autoclave 1 equipped with a lining 3 on the inner surface thereof. In the crystal production apparatus shown in FIG. 2, crystals are grown in the capsule 20 loaded as a reactor (inner cylinder) in the autoclave 1. The inside of the lining 3 and the inside of the capsule 20 comprises a starting material melting region 9 for melting the starting material therein and a crystal growing region 6 for growing crystals therein. A solvent and a mineralizing agent may be put into the starting material melting region 9 along with the starting material 8 thereinto, and in the crystal growing region 6, a seed crystal 7 may be arranged, as hung from a wire or the like. A partition baffle plate 5 is arranged between the starting material melting region 9 and the crystal growing region 6, for partitioning the two regions. Preferably, the opening ratio of the baffle plate 5 is at least 2%, more preferably at least 3%, and is preferably at most 60%, more preferably at most 40%. Preferably, the material of the surface of the baffle plate is the same as the material of the capsule 20 of the reactor. For making it resistant to corrosion and for increasing the purity of the crystals to be grown in the reactor, preferably, the surface of the baffle plate is formed of Ni, Ta, Ti, Nb, Pd, Pt, Au, Ir or their alloy, or pBN, more preferably Pd, Pt, Au, Ir or their alloy, or pBN, even more preferably Pt or its alloy. In the crystal production apparatus shown in FIG. 2, the space between the inner wall 2 of the autoclave 1 and the capsule 20 may be filled with a second solvent. Ammonia as the second solvent may be charged into the space while nitrogen gas is charged thereinto from the nitrogen cylinder 13 via the valve 10 and while the flow rate of ammonia from the ammonia cylinder 12 is confirmed with the mass flow meter 14. In addition, necessary pressure reduction may be attained by the vacuum pump 11. Valves, mass flow meter and ducts are not always necessary for the crystal production apparatus to be used in carrying out the nitride crystal production method of the invention.

Preferably, the material for the lining 3 in FIG. 1 is at least one metal or element of Pt, Ir, Ag, Pd, Rh, Cu, Au and C, or an alloy or a compound containing at least one such metal, more preferably, at least one metal or element of Pt, Ag, Cu and C, or an alloy or a compound containing at least one such metal as facilitating lining therewith. For example, there may be mentioned Pt elementary substance, Pt—Ir alloy, Ag elementary substance, Cu elementary substance, graphite, etc.

(Member)

In carrying out the method of the invention, in general, members are installed inside the reactor. "Member" as referred to herein is one that is installed in the container in producing a nitride crystal according to an ammonothermal method, and means one that can be separated from the reactor. For example, the member includes a growing frame for holding a seed crystal, a baffle plate for controlling the convection flow of solution, a starting material cage, a wire for hanging a seed crystal, etc. In the invention, preferably, the surface of these members is coated with the above-mentioned material having excellent corrosion resistance.

(Production Method)

The steps of the production method of the invention are described in detail hereinunder.

The crystal growing step is a step of growing crystals in the presence of a solvent in a supercritical and/or subcritical state in a reactor.

For the condition of crystal growth, the starting material, the mineralizing agent, the seed crystal and other conditions such as the temperature and the pressure disclosed in JP-A 2009-263229 are preferably employed here. The entire contents of the disclosure of the patent publication are incorporated herein by reference.

Concretely, the seed crystal, the mineralizing agent, the starting material, the solvent, the temperature and the pressure are described below.

In the crystal growing step, preferred is use of a seed crystal as the nucleus for crystal growth. Not specifically defined, the seed crystal is preferably of the same type as that of the crystal to be grown. Specific examples of the seed crystal include, for example, nitride single crystals of gallium nitride (GaN), aluminium nitride (AlN), indium nitride (InN) or mixed crystals thereof, etc.

The seed crystal may be determined in consideration of the lattice matching thereof to the crystal to be grown. For example, as the seed crystal, herein usable are a single crystal obtained by epitaxial growth thereof on a heterogeneous substrate such as sapphire or the like followed by peeling it; a single crystal obtained by crystal growth from a metal such as Ga or the like in a flux of Na, Li or Bi; a single crystal obtained by homo/hetero-epitaxial growth thereof according to a liquid-phase epitaxial method (LPE); a single crystal produced according to a solution growth method; as well as crystals obtained by cutting the single crystals. The concrete method for epitaxial growth is not specifically defined, for which, for example, employable here are a hydride vapor-phase epitaxial (HVPE) method, an metalorganic chemical vapor deposition (MOCVD), a liquid phase method, an ammono-thermal method, etc.

In the crystal growing step in the invention, preferably used is a mineralizing agent. Since the solubility of the starting crystal in a nitrogen-containing solvent such as ammonia is not high, a mineralizing agent is used for increasing the solubility.

The mineralizing agent to be used may be a basic mineralizing agent or an acidic mineralizing agent. The basic mineralizing agent includes compounds containing an alkali metal, an alkaline earth metal or a rare earth metal, and a nitrogen atom, such as alkaline earth metal amides, rare earth amides, alkali metal nitrides, alkaline earth metal nitrides, azide compounds, other hydrazine salts, etc. Preferred are alkali metal amides, concretely including sodium amide ($NaNH_2$), potassium amide ($KNH_2$), lithium amide ($LiNH_2$). As the acidic mineralizing agent, preferred are compounds containing a halogen element. Examples of the mineralizing agent containing a halogen element include ammonium halides, hydrogen halides, ammonium hexahalosilicates, and hydrocarbylammonium fluorides; as well as alkylammonium salts such as tetramethylammonium halides, tetraethylammonium halides, benzyltrimethylammonium halides, dipropylammonium halides, isopropylammonium halides, etc.; alkyl metal halides such as sodium alkyl fluorides, etc.; alkaline earth metal halides, metal halides, etc. Of those, preferred are additives (mineralizing agent) containing a halogen element, such as alkali halides, alkaline earth metal halides, metal halides, ammonium halides, hydrogen halides; and more preferred are alkali halides, ammonium halides, halides of a metal of Group 13 of the Periodic Table, hydrogen halides; and even more preferred are ammonium halides, gallium halides, hydrogen halides. Ammonium halides include, for example, ammonium chloride ($NH_4Cl$), ammonium iodide ($NH_4I$), ammonium bromide ($NH_4Br$), ammonium fluoride ($NH_4F$).

As the mineralizing agent, preferably used is a mineralizing agent containing a fluorine element and at least one selected from other halogen elements composed of chlorine, bromine and iodine. One or more different types of the agents may be used here either singly or as combined.

The combination of the halogen elements to be in the mineralizing agents may be a combination of two elements of chlorine and fluorine, bromine and fluorine, or iodine and fluorine, or may be a combination of three elements of chlorine, bromine and fluorine, chlorine, iodine and fluorine, bromine, iodine and fluorine, or may be a combination of four elements of chlorine, bromine, iodine and fluorine. The combination and the concentration ratio (molar concentration ratio) of the halogen elements to be contained in the mineralizing agent for use in the invention may be suitably determined, depending on the type, the shape and the size of the nitride crystal to be grown, the type, the shape and the size of the seed crystal used, the reaction apparatus used, and the temperature condition and the pressure condition employed.

In the crystal growing step, a mineralizing agent not containing a halogen element may also be used along with the mineralizing agent containing a halogen element. For example, the halogen element-containing mineralizing agent may be used, as combined with an alkali metal amide such as $NaNH_2$, $KNH_2$, $LiNH_2$, etc. In the case where a halogen element-containing mineralizing agent such as ammonium halide is used, as combined with a mineralizing agent containing an alkali metal element or an alkaline earth metal element, preferably, the amount of the halogen element-containing mineralizing agent is larger. Concretely, relative to 100 parts by mass of the halogen element-containing mineralizing agent, the amount of the mineralizing agent containing an alkali metal element or an alkaline earth metal element is preferably at least 0.01 parts by mass, more preferably at least 0.1 parts by mass, even more preferably at least 0.2 parts by mass, and is preferably at most 50 parts by mass, more preferably at most 20 parts by mass, even more preferably at most 5 parts by mass.

For preventing the nitride crystal to be grown in the crystal growing step from being contaminated with impurities, if desired, the mineralizing agent may be used after purified and dried. The purity of the mineralizing agent is generally at least 95%, but is preferably at least 99%, more preferably at least 99.99%.

Preferably, the amount of water and oxygen in the mineralizing agent is as small as possible, and the content thereof is preferably at most 1000 ppm, more preferably at most 10 ppm, even more preferably at most 1.0 ppm.

In the step of crystal growth, an aluminium halide, a phosphorus halide, a silicon halide, a germanium halide, a zinc halide, an arsenic halide, a tin halide, an antimony halide, a bismuth halide or the like may be present in the reactor.

The molar concentration of the halogen element contained in the mineralizing agent to the solvent is preferably at least 0.1 mol %, more preferably at least 0.3 mol %, even more preferably at least 0.5 mol %. Also preferably, the molar concentration of the halogen element contained in the mineralizing agent to the solvent is at most 30 mol %, more preferably at most 20 mol %, even more preferably at most 10 mol %. When the concentration is too low, then the solubility may lower and the growing speed may lower. On the other hand, when the concentration is too high, then the solubility may be too high and spontaneous nucleation may increase, or the degree of supersaturation may be too high and crystal growth control may be difficult.

In the crystal growing step in the invention, used is a starting material that contains the elements to constitute the semiconductor crystal to be grown on the seed crystal. For example, in the case where a nitride crystal of a Group 13 element of the Periodic Table is to be grown, used is a starting material that contains the Group 13 element of the Periodic Table. Preferably used are a polycrystalline starting material of a Group 13 nitride crystal and/or a Group 13 metal, more preferably gallium nitride and/or metal gallium. It is not necessary that the polycrystalline starting material is a complete nitride, but as the case may be, the material may contain a metallic ingredient of a Group 13 element that is in a state of metal (zero valence); and for example, in the case where the crystal is gallium nitride, usable is a mixture of gallium nitride and metal gallium.

The method for producing the polycrystalline starting material is not specifically defined. For example, herein usable is a nitride polycrystal produced by reacting a metal or its oxide or hydroxide with ammonia in a reactor in which ammonia gas is kept circulating. As a metal compound starting material having a higher reactivity, also usable here are halides, amide compounds, imide compounds, or compounds having a covalent M-N bond such as galazan, etc. Further usable are nitride polycrystals produced through reaction of a metal such as Ga with nitrogen at high temperature and high pressure.

The amount of water and oxygen in the polycrystalline starting material for use in the invention is preferably as small as possible. The oxygen content in the polycrystalline starting material is generally at most 10000 ppm, but is preferably at most 1000 ppm, more preferably at most 1 ppm. The easiness in contamination of the polycrystalline starting material with oxygen has a relation with the reactivity thereof with water or the water absorbability thereof. When the crystallinity of the polycrystalline starting material is worse, then a larger amount of an active group such as NH group exists in the surface of the material, and the group may react with water to partly give an oxide or a hydroxide. Accordingly, in general, it is desirable that the crystallinity of the polycrystalline starting material to be used here is as high as possible. The crystallinity may be estimated as the half value width in powdery X-ray diffractiometry, in which the half value width of the diffraction line at (100) (in hexagonal gallium nitride, $2\theta$=about 32.5°) is generally at most 0.25°, but is preferably at most 0.20°, more preferably at most 0.17°.

The solvent to be used in the crystal growing step is preferably a solvent containing nitrogen. As the nitrogen-containing solvent, there may be mentioned a solvent that does not detract from the stability of the nitride single crystal to be grown. The solvent includes, for example, ammonia, hydrazine, urea, amines (e.g., primary amines such as methylamine, secondary amines such as dimethylamine, tertiary amines such as trimethylamine, diamines such as ethylenediamine), melamine, etc. One or more these solvents may be used here either singly or as combined.

Preferably, the amount of water and oxygen in the solvent is as small as possible; and preferably, the content thereof is at most 1000 ppm, more preferably at most 10 ppm, even more preferably at most 0.1 ppm. In the case where ammonia is used as the solvent, its purity is generally at least 99.9%, but is preferably at least 99.99%, more preferably at least 99.999%, even more preferably at least 99.9999%.

In the crystal growing step, the whole of the reactor is heated so that the inside thereof could be in a supercritical and/or subcritical state. In the supercritical state, in general, the viscosity thereof is low and the material may diffuse more readily than liquid but has a solvation force on the same level as that of liquid. The subcritical state means a state of liquid that has a density nearly equal to the critical density thereof at around the critical temperature. For example, in the starting material filling region, the starting material may be melted in a supercritical state, and in the crystal growing region, the temperature may be so changed that the melted material could be in a subcritical state to thereby attain the crystal growth by utilizing the solubility difference of the starting material between the supercritical state and the subcritical state thereof.

In order to be in a supercritical state, the reaction mixture is kept generally at a temperature higher than the critical point of the solvent. In the case where an ammonia solvent is used, the critical point thereof is such that the critical temperature is 132° C. and the critical pressure is 11.35 MPa, but when the filling ratio to the capacity of the reactor is high, the pressure could be far higher than the critical pressure even at a temperature lower than the critical temperature. In the invention, the "supercritical state" includes the state exceeding the critical pressure. Since the reaction mixture is sealed up in a reactor having a predetermined capacity, the temperature elevation increases the pressure of the fluid. In general, when $T>T_C$ (critical temperature of one solvent) and $P>P_C$ (critical pressure of one solvent), then the fluid is in a supercritical state.

Under the supercritical condition, a semiconductor crystal can grow at a sufficient growing speed. The reaction time depends especially on the reactivity of the mineralizing agent and the thermodynamic parameters, or that is, the numerical values of the temperature and the pressure. During synthesis or growth of a semiconductor crystal, the pressure in the reactor is preferably at least 120 MPa, from the viewpoint of the crystallinity and the productivity of the crystal, more preferably at least 150 MPa, even more preferably at least 180 MPa. On the other hand, from the viewpoint of the safety thereof, the inner pressure of the reactor is preferably at most 700 MPa, more preferably at most 500 MPa, even more preferably at most 350 MPa, still more preferably at most 300 MPa. The pressure may be suitably defined depending on the temperature and on the filling ratio of the solvent volume to the capacity of the reactor. Naturally, the inner pressure of the reactor could be indiscriminately defined according to the temperature and the filling ratio, but in fact, the pressure may differ in some degree depending on the starting material, the additives such as the mineralizing agent, the ununiformity of the temperature in the reactor, and the presence of a free volume therein.

Regarding the temperature range in the reactor, preferably, the lower limit thereof is not lower than 500° C. from the viewpoint of the crystallinity and the productivity of the crystal to be grown therein, but more preferably not lower than 515° C., even more preferably not lower than 530° C. The upper limit is preferably not higher than 700° C. from the viewpoint of the safety, more preferably not higher than 650° C., even more preferably not higher than 630° C. In the production method for a nitride crystal of the invention, preferably, the temperature of the starting material filling region in the reactor is higher than the temperature in the crystal growing region. The temperature difference between the starting material filling region and the crystal growing region ($|\Delta T|$) is preferably at least 5° C. from the viewpoint of the crystallinity and the productivity, more preferably at least 10° C., but is preferably at most 100° C., more preferably at most 90° C., even more preferably at most 80° C. The optimum temperature and pressure inside the reactor may be suitably defined depending on the type and the amount of the mineralizing agent, the additives and others to be used in crystal growth.

The injection ratio of the solvent, or that is, the filling ratio thereof into the reactor for attaining the above-mentioned temperature range and pressure range inside the reactor is generally at least 20% of the free volume of the reactor, or that is, in the case where a polycrystalline starting material and a seed crystal are used in the reactor, the remaining volume to be computed by subtracting the volume of seed crystal and the structure to house it therein from the volume of the reactor, or in the case where a baffle plate is arranged in the reactor, the remaining volume to be computed by further subtracting the volume of the baffle plate from the volume of the reactor, based on the liquid density at the boiling point of the solvent, but preferably at least 30%, more preferably at least 40%, and is generally at most 95%, preferably at most 80%, more preferably at most 70%.

In the reactor, the semiconductor crystal is grown by heating the reactor with an electric furnace having a thermocouple to thereby make the reactor have a subcritical and/or supercritical state of the solvent such as ammonia or the like therein. Regarding the heating method, the heating speed up to a predetermined temperature is not specifically defined, but in general, the heating may take from a few hours to a few days. If desired, the heating may be attained in multiple stages, or in the heating temperature range, the heating speed may be changed. As the case may be, the reactor may be heated while partially cooled.

Regarding the above-mentioned "reaction temperature", the inner temperature of the reactor may be converted and estimated from the temperature measured with a thermocouple arranged in contact with the outer surface of the reactor and/or with a thermocouple inserted through the hole formed in the outer surface of the reactor into a predetermined depth. In general, the mean value of the temperature in the starting material melting region and the temperature in the crystal growing region is the mean temperature.

In the production method for a semiconductor crystal of the invention, the seed crystal may be pre-treated. For the pre-treatment, for example, the seed crystal may be processed for melt-back treatment, or the growing face of the seed crystal may be polished, or the seed crystal may be washed.

The reaction time after the system has reached a predetermined temperature may be generally from a few hours to hundreds of days, though varying depending on the type of the semiconductor crystal, the type of the starting material and the mineralizing agent to be sued, and the size and the amount of the crystal to be produced. During the reaction, the reaction temperature may be kept constant, or may be elevated or lowered. After the reaction time necessary for forming a desired crystal has been taken, the system is cooled. The cooling method is not specifically defined. For example, the heater may be stopped and the reactor may be kept as it is in the furnace to be cooled therein, or the reactor may be taken out of the electric furnace to be cooled in air. If desired, use of a coolant is favorable for rapid cooling.

After the temperature of the outer surface of the reactor or the estimated inner temperature of the reactor has reached a predetermined temperature or lower, the reactor is opened. In this state, the given temperature is not specifically defined, but may be generally not lower than −80° C., preferably not lower than −33° C., and may be generally not higher than 200° C., preferably not higher than 100° C. As the case may be, a duct may be connected to the pipe connecting port of the valve connected to the reactor, and this may be made to communicate with a container filled with water or the like, and the valve may be opened to cool the reactor. Further if desired, the ammonia solvent may be fully removed away from the reactor by degassing into vacuum, and then the reactor may be dried and opened, and thereafter the formed nitride crystal, the unreacted starting material and the additives such as the mineralizing agent and others may be taken out of the reactor.

The film forming step is a step of coating at least a part of the inner surface of the reactor and the surface of the member to be used inside the reactor with a platinum group-Group 13 metal alloy to form thereon a platinum group-Group 13 metal alloy coating film.

(Platinum Group-Group 13 Metal Alloy Coating Film)

A platinum group-Group 13 metal alloy is extremely stable to a solvent in a supercritical and/or subcritical state and to solution of a mineralizing agent and a starting material dissolved in the solvent, and therefore, in case where at least a part of the inner surface of the reactor and the surface of the member to be used inside the reactor is coated with a platinum group-Group 13 metal alloy, then the reactor and the member are not corroded and the impurities in the nitride crystal to be obtained can be reduced. For reducing more the impurities, preferably, at least 50% of the total area of the inner surface of the reactor and the surface of the member to be used inside the reactor is coated, more preferably at least 70%, even more preferably at least 80%, still more preferably at least 90%; and 100% may be coated.

Not specifically defined, the platinum group-Group 13 metal alloy coating film may be any one containing an alloy of a platinum group element and a Group 13 element, and may contain any other metal so far as it exhibits the effect of the invention. For example, the film may contain a metal that functions as a dopant for nitride crystals, such as Si, Ca, Mg, Zn, etc.

The platinum group element to constitute the platinum group-Group 13 metal alloy coating film includes ruthenium (Ru), rhodium (Rh), palladium (Pd), osmium (Os), iridium (Ir), platinum (Pt), and is preferably a metal at least containing Pt.

The Group 13 metal to constitute the platinum group-Group 13 metal alloy coating film includes aluminium (Al), gallium (Ga), indium (In), thallium (Tl), etc., and is preferably a metal at least containing Ga.

Concretely, the platinum group-Group 13 metal alloy includes $Ga_3Pt_5$, $Ga_3Pt_2$, $GaPt$, $Ga_2Pt$, $Ga_2Pt$, $GaPt_2$, $GaPt_3$, etc. As the platinum group-Group 13 metal alloy coating film, preferred is a coating film containing at least one alloy selected from $Ga_3Pt_5$, $Ga_3Pt_2$, $GaPt$, $Ga_2Pt$, $Ga_2Pt$, $GaPt_2$ and $GaPt_3$. The platinum group-Group 13 metal alloy coating film may contain an element other than Ga and Pt as an impurity. The platinum group-Group 13 metal alloy coating film may contain, for example, Si in an amount of 10 ppm or less, Ir in an amount of 500 ppm or less and other platinum group elements in an amount of 100 ppm or less as impurities.

Not specifically defined, the thickness of the platinum group-Group 13 metal alloy coating film to be formed in the film forming step is preferably at least 5 µm, more preferably at least 10 µm, even more preferably at least 15 µm, still more preferably at least 20 µm, and is preferably at most 100 µm. In case where the thickness is at least 5 µm, it is favorable since the coating film may hardly peel away even when the members may be kept in contact with each other in the pretreatment step for crystal growth and therefore handlability of the production apparatus is good; and when the thickness is at most 100 µm, the coating film itself is tough and hardly peels away.

In case where the film forming step is carried out multiple times, the platinum group-Group 13 metal alloy coating film formed may be thicker with the increase in the frequency of the forming step.

(Film Forming Method)

The method for forming the platinum group-Group 13 metal alloy coating film is not specifically defined. For example, the film may be formed by increasing the temperature and the pressure in an environment in a reactor in which a platinum group metal and a Group 13 metal exist.

The platinum group metal existing inside the reactor is favorable since it can efficiently form the intended platinum group-Group 13 metal alloy coating film in the part of the surface of the container and the member themselves to be coated with a platinum group-Group 13 metal alloy. The Group 13 metal existing in the reactor may be derived from the starting material in case where a Group 13 metal is used as the starting material. Besides the starting material for the crystal and the material of the reactor, a platinum group metal and a group-Group 13 metal may be placed in the reactor as a starting material for a platinum group-Group 13 metal alloy coating film.

The temperature in forming the coating film is preferably not lower than 400° C., more preferably not lower than 450° C., even more preferably not lower than 500° C., still more preferably not lower than 530° C., and is preferably not higher than 700° C., more preferably not higher than 670° C., even more preferably not higher than 650° C. When the temperature is not lower than the lower limit, then it is favorable since a more stable coating film can be formed.

The pressure in forming the coating film is preferably not lower than 80 MPa, more preferably not lower than 100 MPa, even more preferably not lower than 120 MPa, and is preferably not higher than 700 MPa, more preferably not higher than 500 MPa, even more preferably not higher than 400 MPa, still more preferably not higher than 300 MPa. When the pressure is not lower than the lower limit, then it is favorable since a more stable coating film can be formed.

In forming the coating film, a supercritical solvent and a mineralizing agent may exist in the reactor. In case where the film forming step is simultaneously carried out with the crystal growing step in at least a part of the crystal growing step, the process can be simplified. Preferably, therefore, the condition in the film forming step is the same as in the crystal growing step.

The film forming step may be carried out in the state where a platinum group-Group 13 metal alloy coating film has already been formed on the inner surface of the reactor and on the surface of the member to be used inside the reactor.

In forming the coating film, preferably, any other substance than the substances necessary in the crystal growing step, such as oxygen, water, etc., is removed. Concretely, it is desirable that the concentration of the substances is at most 100 ppm, more preferably at most 50 ppm, even more preferably at most 10 ppm. As a concrete method of reducing the substances, there may be mentioned nitrogen purging, vacuuming or the like inside the reactor. Preferably, nitrogen purging and vacuuming are combined. Along with vacuuming, the reactor may be heated. In the invention, preferably, a capsule formed of a platinum group metal or an alloy containing a platinum group metal is used as the reactor since oxygen and other gases can be efficiently removed from the reactor. As the reactor, preferred is used of a capsule formed of a platinum group metal or an alloy containing a platinum group metal. For example, preferred is use of a capsule formed of a Pt-containing alloys, and for example, preferably used is a capsule formed of a Pt—Ir alloy. Regarding the others such as oxygen removal from the container, referred to is the techniques described in WO2010/079814. The entire contents of the disclosure of the patent publication are incorporated herein by reference. Specifically, for example, introduction of a mineralizing agent in a gas state is preferable since oxygen is hardly introduced with the introduction of the mineralizing agent to keep the content of the oxygen in the reactor lower. For example, in the case where a hydrogen halogenide gas is introduced into the reactor, the hydrogen halogenide per se may be used as a mineralizing agent or an ammonium halogenide may be produced as a mineralizing agent by reacting the hydrogen halogenide and ammonia charged into the reactor.

In the invention, preferably, the above-mentioned conditions for forming a platinum group-Group 13 metal alloy coating film are combined. For example, preferred is an embodiment where the inside in the reactor is set at a temperature of from 400 to 700° C. under a pressure of from 100 to 700 MPa in the presence of supercritical ammonia and a Group 13 metal.

(Semiconductor Crystal)

In the semiconductor crystal obtained according to the production method of the invention, platinum group and other impurities can be reduced, which, however, heretofore could not be removed away completely. In particular, the invention can provide a Group 13 element nitride semiconductor crystal, in which the concentration of the platinum group metal element to be contained therein as an impurity is at most 10 times, preferably at most 5 times the concentration thereof in the Group 13 element nitride semiconductor crystal grown in the absence of a platinum group metal.

In this, the Group 13 element nitride semiconductor crystal grown in the absence of a platinum group metal includes, for example, a Group 13 element nitride semiconductor crystal obtained according to a hydride vapor phase epitaxial (HVPE) method using a crystal growth apparatus not containing a platinum group metal. According to the method, since a platinum group element does not exist in the growth atmosphere, it is considered that no platinum group metal is contained in the obtained crystal.

For reference, an HVPE production method for a Group 13 element nitride semiconductor crystal is described below; however, in the invention, the production method is not limited thereto, but may be any one for crystal growth in the absence of a platinum group metal.

Figure 3:
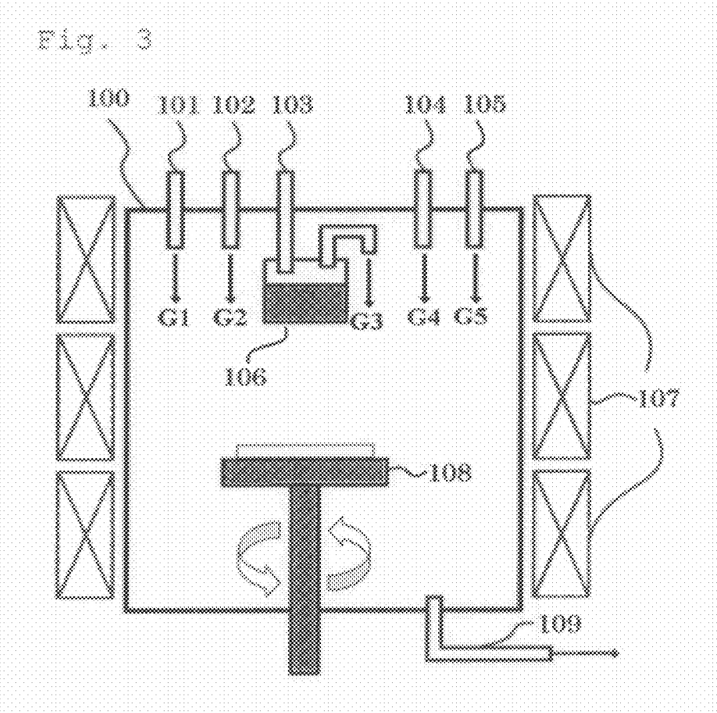
FIG. 3 is a graphical view of one embodiment of a crystal production apparatus for an HVPE method.

Using the apparatus shown in FIG. 3, a Group 13 element nitride semiconductor crystal can be grown according to an HVPE method.

1) Basic Structure

The production apparatus of FIG. 3 comprises a susceptor 108 on which the ground substrate is mounted, and a reservoir 106 to reserve therein the starting material for the Group III nitride to be grown, in the reactor 100. The apparatus further comprises ducts 101 to 105 for introducing gases into the reactor 100, and an exhaust pipe 109 for gas emission. In addition, the apparatus is equipped with the heater 107 to heat the reactor 100 from the side thereof.

2) Material of Reactor, Type of Atmosphere Gas

As the material of the reactor 100, usable are quartz, sintered boron nitride, stainless, etc. Preferred is quartz. The reactor 100 is previously filled with an atmosphere gas. As the atmosphere gas (carrier gas), for example, there may be mentioned an inert gas or the like such as hydrogen, nitrogen, He, Ne, Ar, etc. A mixture of these gases may be used here.

3) Material and Shape of Susceptor, Distance from Growing Face to Susceptor

As the material of the susceptor 108, preferred is carbon, and more preferred is one coated with SiC on the surface thereof. Not specifically defined, the shape of the susceptor 108 may be any one on which the ground substrate for crystal growth thereon for use in the invention can be mounted, but is preferably one not having any structural object around the crystal growing face in crystal growth. In the case where any structural object that may grow exists around the crystal growing face, then a polycrystalline substance may adhere thereto and may produce an HCl gas as its product thereby having some negative influence on the crystal being grown. The contact face between the ground substrate and the susceptor 108 is preferably spaced from the crystal growing face of the ground substrate by at least 1 mm, more preferably by at least 3 mm, even more preferably by at least 5 mm.

4) Reservoir

A material for the Group 13 element nitride to be grown is put in the reservoir 106. Concretely, a material to be the Group 13 element source is put therein. The starting material to be the Group 13 element source includes Ga, Al, In, etc. Through the duct 103 through which a gas is introduced into the reservoir 106, a gas capable of reacting with the starting material put in the reservoir 106 is fed thereinto. For example, in the case where a starting material to be the Group 13 element source is put in the reservoir 106, an HCl gas may be fed thereinto through the duct 103. In this case, a carrier gas may be fed through the duct 103 along with the HCl gas therethrough. As the carrier gas, for example, there may be mentioned an inert gas such as hydrogen, nitrogen, He, Ne, Ar or the like. These gases may be mixed for use herein.

5) Nitrogen Source (Ammonia), Separate Gas, Dopant Gas

Through the duct 104, a starting gas to be a nitrogen source is fed into the reactor. In general, $NH_3$ is fed. Through the duct 101, a carrier gas is fed. As examples of the carrier gas, there may be mentioned the same ones as those of the carrier gas to be fed through the duct 103. The carrier gas has an effect of separating the starting material gas from the nozzle so as to prevent a polycrystal from adhering to the nozzle tip. Through the duct 102, a dopant gas may be fed, and through the duct 105, HCl may be fed for cleaning up the inside of the reactor by etching the polycrystal and others therein.

6) Gas Introduction Method

The above-mentioned gases to be fed through the ducts 101 to 105 may be exchanged for each other and may be fed through any other duct. The starting gas to be the nitrogen source and the carrier gas may be fed through the same duct, as mixed. Further, the carrier gas may be fed through any other duct and may be mixed. These supply modes may be suitably defined, depending on the size and the shape of the reactor 100, the reactivity of the starting material, the growing speed of the intended crystal, etc.

7) Installation Site for Exhaust Pipe

The gas exhaust pipe 109 may be installed through the top, the bottom or the side of the inner wall of the reactor. From the viewpoint of dust removal, the gas exhaust pipe is preferably in the lower part than the crystal growth end, and as in FIG. 3, the gas exhaust pipe 109 is installed through the reactor bottom.

8) Crystal Growth Condition

Using the above-mentioned production apparatus, the crystal growth is attained generally at 950° C. or higher, preferably at 970° C. or higher, more preferably at 980° C. or higher, even more preferably at 990° C. or higher. In general, the crystal growth is attained at 1120° C. or lower, preferably at 1100° C. or lower, more preferably at 1090° C. or lower, even more preferably at 1080° C. or lower. Preferably, the pressure inside the reactor is at least 10 kPa, more preferably at least 30 kPa, even more preferably at least 50 kPa, and is preferably at most 200 kPa, more preferably at most 150 kPa, even more preferably at most 120 kPa.

9) Crystal Growing Speed

The growing speed in crystal growth using the above-mentioned production apparatus may vary depending on the growing method, the growth temperature, the starting material supply rate, the plane direction for crystal growth, etc.; but in general, the speed falls within a range of from 5 μm/hr to 500 μm/hr, preferably at least 10 μm/hr, more preferably at least 50 μm/hr, even more preferably at least 70 μm/hr. The growing speed may be controlled by suitably defining the type and the flow rate of the carrier gas used, the distance between the supply port and the crystal growth end, etc., in addition to the above.

EXAMPLES

The characteristics of the invention are described more concretely with reference to the following Examples and Comparative Examples. In the following Examples, the material used, its amount and ratio, the details of the treatment and the treatment process may be suitably modified or changed not overstepping the sprit and the scope of the invention. Accordingly, the invention should not be limitatively interpreted by the Examples mentioned below.

<Evaluation Method>
1) Presence or Absence of Formation of Platinum Group-Group 13 Metal Alloy Coating Film:

In each Example, the inner surface of the reactor was visually observed after the crystal growth, and evaluated in point of the presence or absence of the formation of a platinum group-Group 13 metal alloy coating film thereon, according to the following two-grade evaluation.

O: A platinum group-Group 13 metal alloy coating film was formed. Not having a metallic gloss, the surface turned gray.

x: A platinum group-Group 13 metal alloy coating film was not formed. Like before the crystal growth, the surface still had a metallic gloss.

2) Analysis of Platinum Group-Group 13 Metal Alloy Coating Film:

In X ray diffractiometry, the coating film was analyzed for the presence or absence of diffraction peaks for platinum group metal-Group 13 metal. In addition, in EDS, the film was elementary-analyzed for the platinum group metal and the Group 13 metal.

3) Analysis of Impurities in Nitride Crystal:

The nitride crystal was elementary-analyzed through SIMS for the platinum group metal therein. As the measuring apparatus, used was a secondary ion mass spectrometer. For reference, in order to grow a crystal in the absence of Pt and Ir, employed here was a crystal free from Pt and Ir, as produced through HVPE.

Example 1

In this Example, the reaction apparatus shown in FIG. 2 was used to grow a nitride crystal.

A RENE 41-made autoclave 1 (inner capacity, about 345 cm$^3$) was used as a pressure container, in which a Pt—Ir-made capsule 20 was used as a reactor for crystal growth. The capsule was filled in a fully-dried nitrogen atmosphere globe box. As the starting material 8, 36 g of polycrystalline GaN particles were metered and set in the lower region of the capsule (starting material melting region 9). Next, as a mineralizing agent, 2.0 g of fully-dried NH$_4$Cl having a purity of 99.99% was metered and put into the capsule.

Further, a platinum-made baffle plate 5 (opening area ratio 15%) was arranged between the lower starting material melting region 9 and the upper crystal growing region 6. As the seed crystal 7, used were 6 sheets of hexagonal-system GaN single-crystal (10 mm×5 mm×0.3 mm) having grown through HVPE and one granular crystal (about 5 mm×5 mm×5 mm) having formed through spontaneous nucleation in HVPE. The main plane of the seed crystal was finished by a chemical mechanical polish (CMP), and it was confirmed that the surface roughness Rms, as measured with an atomic force microscope, was 0.5 nm. These seed crystals 7 were hung on a platinum-made seed crystal supporting frame via a metal wire having a diameter of 0.2 mm, and set in the upper crystal growing region 6 of the capsule.

Next, a Pt—Ir-made cover was TIG-welded to the top of the capsule 20, and then the weight was measured. A valve similar to the valve 10 in FIG. 2 was connected to the tube attached to the top of the cover, and the valve was controlled so as to communicate with the vacuum pump 11, via which the capsule was degassed in vacuum. Next, the valve was controlled so as to communicate with the nitrogen cylinder 13, by which the capsule was purged with a nitrogen gas. The degassification in vacuum and the nitrogen purging were attained five times each, and then while the vacuum state thereof was kept as such, the capsule was cooled with a dry ice/ethanol solvent, and then the valve was once closed. Subsequently, the valve of the duct was controlled so as to communicate with the NH$_3$ cylinder 12, then the valve was again opened and the capsule was charged with NH$_3$ not aired out. Then, the valve was again closed. The filling amount was confirmed from the difference between the weights before charging with NH$_3$ and after charging therewith.

Subsequently, the cover of the autoclave equipped with the valve 10 was closed, and the weight of the autoclave 1 was metered. Next, the valve 10 attached to the autoclave was controlled so that the duct could communicate with the vacuum pump 11, and the valve was opened for degassification in vacuum. Like the capsule, this was nitrogen-purged multiple times. Afterwards, while kept in vacuum, the autoclave 1 was cooled with a dry ice/methanol solvent, and the valve 10 was once closed. Next, the valve was again controlled so that the duct could communicate with the NH$_3$ cylinder 12, and then the valve 10 was again opened so the autoclave 1 was charged with NH$_3$ while continuously protected from being aired out. Then, the valve 10 was again closed. The temperature of the autoclave 1 was restored to room temperature, the outer surface thereof was fully dried, and the weight of the autoclave 1 was metered. The weight NH$_3$ was computed from the difference between the weights before and after charging with NH$_3$, and the filling amount was thereby confirmed.

Subsequently, the autoclave 1 was housed in an electric furnace composed of two-divided upper and lower heater sections. This was heated so that the temperature in the crystal growing region of the outer surface of the autoclave could be 590° C., and the temperature in the starting material melting region could be 630° C. (temperature difference, 40° C.), taking 9 hours, and then after the temperature reached the targeted level, this was kept at that temperature for 108 hours. The inner pressure of the autoclave was 246 MPa. While kept at the preset temperature, the fluctuation in the autoclave outer surface control temperature was not more than ±0.3° C.

Afterwards, this was spontaneously cooled until the outer surface temperature of the autoclave 1 could be restored to room temperature, then the valve 10 attached to the autoclave was opened, and NH$_3$ in the autoclave was removed. Next, the autoclave 1 was weighed, and the NH$_3$ emission was thereby confirmed, and then the cover of the autoclave was opened and the capsule 20 was taken out. A hole was formed in the tube attached to the top of the capsule and NH$_3$ was removed from the capsule. The inside of the capsule was checked. As a result, a gallium nitride crystal was deposited uniformly on the entire surface of the seed crystal having a size of 5×10 mm square. The gallium nitride crystal growing on the seed crystal was analyzed through X ray diffractiometry, and as a result, it was confirmed that the crystal was a hexagonal crystal not containing cubic crystal GaN. It was confirmed that the inner surface of the capsule and the surface of the members in the capsule were coated with a dull silver coating film. The coating film was formed in the entire region covering all the upper crystal precipitating region and the lower starting material melting region in the capsule. The coating film was analyzed through X ray diffractiometry and, as a result, the diffraction peaks corresponded to those of $Ga_3Pt_5$; and in elementary analysis through EDS, only Ga and Pt were detected. Accordingly, it was confirmed that the inner surface of the capsule and the surface of the Pt alloy members were coated with a coating film of $Ga_3Pt_5$ in 100% of the total area. The cross section of the coating film was observed through SEM, and the thickness of the film was about 30 μm.

Example 2

In this Example, an $NH_4Cl$ reagent was used like in Example 1, and the apparatus was operated under the condition shown in Table 1. After the operation, it was visually confirmed that the inner surface of the capsule and the surface of the members in the capsule were coated with a dull silver coating film.

Example 3

In this Example, high-purity HCl gas was introduced into the capsule in place of the $NH_4Cl$ reagent serving as a mineralizing agent, and reacted with ammonia to generate $NH_4Cl$ inside the capsule. Using the HCl gas made it possible to remove water and oxygen contained in the $NH_4Cl$ reagent. The other steps were the same as in Example 1, and the operation condition is shown in Table 1.

In Example 3, for confirming the amount of the formed Ga—Pt alloy coating film, a Pt plate having a diameter of 21 mm, a thickness of 0.35 mm and a weight of 2.3332 g was arranged in the starting material melting region 9 in the lower part of the capsule.

After the operation, the Pt plate was taken out of the capsule, and the surface thereof was observed with the naked eye. The surface was colored in dull silver, which confirmed the formation of a Ga—Pt alloy coating film. The weight was metered and was 2.3615 g, or that is, a weight increase of 0.0283 g over the original weight was confirmed.

Examples 4 to 6

In Examples 4 to 6, high-purity HCl gas was introduced into the capsule in place of the $NH_4Cl$ reagent serving as a mineralizing agent, like in Example 3, and reacted with ammonia to generate $NH_4Cl$ in the capsule, and the apparatus was operated under the condition shown in Table 1. In all of Examples 4, 5 and 6, after the operation, it was visually confirmed that the inner surface of the capsule and the surface of the members inside the capsule were coated with a dull silver coating film.

Example 7

In this Example, $NH_4I$ was used as the mineralizing agent as shown in Table 1. The operation condition is shown in Table 1. After the operation, it was confirmed that the inner surface of the capsule and the surface of the members inside the capsule were coated with a dull silver coating film. The coating film was formed everywhere in all the crystal growing region 6 in the upper part of the capsule and the starting material melting region 9 in the lower part of the capsule.

Example 8

In this Example, the Pt plate with the Ga—Pt alloy coating film attached thereto in Example 3 was again put into the capsule. The operation condition is shown in Table 1.

After the operation, the Pt plate was taken out of the capsule, and the surface thereof was observed with the naked eye. The same dull silver as that of the plate before again put into the furnace was observed on the surface, which confirmed the formation of a Ga—Pt alloy coating film on the plate. The weight of the Pt plate increased from 2.3615 g up to 2.3744 g, and the weight increase by 0.0129 g was confirmed over the weight before again put into the furnace.

Example 9

In this Example, the Pt plate with the Ga—Pt alloy coating film attached thereto in Example 8 was again put into the capsule. The operation condition is shown in Table 1.

After the operation, the Pt plate was taken out of the capsule, and the surface thereof was observed with the naked eye. The same dull silver as that of the plate before again put into the furnace was observed on the surface, which confirmed the formation of a Ga—Pt alloy coating film on the plate. The weight of the Pt plate increased from 2.3744 g up to 2.3855 g, and the weight increase by 0.0111 g was confirmed over the weight before again put into the furnace.

Example 10

In this Example, the Pt plate with the Ga—Pt alloy coating film attached thereto in Example 9 was again put into the capsule. The operation condition is shown in Table 1.

After the operation, the Pt plate was taken out of the capsule, and the surface thereof was observed with the naked eye. The same dull silver as that of the plate before again put into the furnace was observed on the surface, which confirmed the formation of a Ga—Pt alloy coating film on the plate. The weight of the Pt plate increased from 2.3853 g up to 2.4006 g, and the weight increase by 0.0153 g was confirmed over the weight before again put into the furnace.

Example 11

In this Example, the Pt plate with the Ga—Pt alloy coating film attached thereto in Example 10 was again put into the capsule. The operation condition is shown in Table 1.

After the operation, the Pt plate was taken out of the capsule, and the surface thereof was observed with the naked eye. The same dull silver as that of the plate before again put into the furnace was observed on the surface, which confirmed the formation of a Ga—Pt alloy coating film on the plate. The weight of the Pt plate increased from 2.4006 g up to 2.4077 g, and the weight increase by 0.0071 g was confirmed over the weight before again put into the furnace. As shown in the above Examples 3, 8, 9, 10 and 11, after the Ga—Pt coating film has been formed thereon, the weight of the plate gradually increases after repeated use thereof. In other words, the above show that the Ga—Pt alloy is stable in a high-temperature high-pressure ammonothermal environment and is not corroded. When coated with a Ga—Pt alloy, the capsule material, Pt and Pt alloy was prevented from being corroded, and the life of the capsule was prolonged and the purity of the crystal formed was increased.

Example 12

In this Example, the apparatus was operated according to the same process as in Example 3 and under the condition shown in Table 1.

After the operation, it was confirmed that the inner surface of the capsule and the surface of the members in the capsule were coated with a dull silver coating film. The coating film was formed everywhere in all the upper crystal growing region and the lower starting material melting region of the capsule.

Example 13

In this Example, the apparatus was operated according to the same process as in Example 3 and under the condition shown in Table 1.

After the operation, it was confirmed that the inner surface of the capsule and the surface of the members in the capsule were coated with a dull silver coating film. The coating film was formed everywhere in all the upper crystal growing region and the lower starting material melting region of the capsule.

Comparative Example 1

In this Comparative Example, an autoclave lined with Pt and a Pt—Ir alloy on the inner surface thereof was used, not using a capsule therein, and operated under the condition shown in Table 1.

After the operation, the inner surface of the capsule and the surface of the members in the capsule showed metallic gloss, and the formation of a Ga—Pt alloy thereon was not confirmed.

The grown crystal was analyzed through SIMS for Pt and Ir therein, and Ir gave $7.51 \times 10^2$ counts/sec, and Pt gave $2.74 \times 10^2$ counts/sec.

Example 14

In this Example, the apparatus was operated according to the same process as in Example 1 under the condition shown in Table 1 using $NH_4I$ and $GaF_3$ as the mineralizing agent. The mineralizing agent concentration shown in Table 1 is the total halogen concentration of $NH_4I$ and $GaF_3$.

After the operation, it was confirmed that the inner surface of the capsule was coated with a dull silver coating film. The coating film was formed everywhere in all the upper crystal growing region and the lower starting material melting region of the capsule.

TABLE 1

| | $NH_3$ Filling Rate (%) | Type of Mineralizing Agent | Concentration of Mineralizing Agent (mol %) | Operation Time (day) | Weight of Starting Material (g) | Temperature in Crystal Growing Region (° C.) | Temperature in Starting Material Melting Region (° C.) | Pressure (MPa) | Presence or Absence of Ga—Pt Alloy Coating Film |
|---|---|---|---|---|---|---|---|---|---|
| Example 1 | 58 | $NH_4Cl$ | 1 | 4.5 | 36 | 590 | 630 | 246 | ○ |
| Example 2 | 61 | $NH_4Cl$ | 1 | 3.6 | 36 | 530 | 630 | 248 | ○ |
| Example 3 | 60 | HCl gas | 3 | 4.7 | 50 | 560 | 600 | 242 | ○ |
| Example 4 | 58 | HCl gas | 6 | 4.8 | 50 | 595 | 625 | 239 | ○ |
| Example 5 | 46 | HCl gas | 3 | 4.8 | 60 | 595 | 625 | 158 | ○ |
| Example 6 | 58 | HCl gas | 9 | 5.7 | 100 | 600 | 620 | 240 | ○ |
| Example 7 | 59 | $NH_4I$ | 1 | 4.7 | 100 | 600 | 620 | 239 | ○ |
| Example 8 | 59 | HCl gas | 3 | 3.7 | 50 | 610 | 640 | 243 | ○ |
| Example 9 | 60 | HCl gas | 6 | 5.7 | 51 | 595 | 625 | 250 | ○ |
| Example 10 | 60 | HCl gas | 9 | 3.6 | 50 | 610 | 625 | 275 | ○ |
| Example 11 | 59 | HCl gas | 9 | 7.6 | 50 | 600 | 620 | 250 | ○ |
| Example 12 | 58 | HCl gas | 6 | 4.7 | 50 | 595 | 625 | 249 | ○ |
| Example 13 | 60 | HCl gas | 3 | 14.7 | 130 | 595 | 625 | 256 | ○ |
| Example 14 | 55 | $NH_4I + GaF_3$ | 2.25 | 11.9 | 140 | 600 | 630 | 215 | ○ |
| Comparative Example 1 | 50 | $NH_4Cl$ | 2.25 | 4 | 21 | 470 | 600 | 164 | x |

<Measurement of Amount of Contaminants, Pt and Ir in Grown Crystal>

Table 2 shows the results of SIMS analysis of the crystals in Examples 7, 12 and 13 and Comparative Example 1 and the crystals (used as reference) grown through HVPE with no contamination with Pt and Ir. As shown in Table 2, the data of the crystals in Examples 7, 12 and 13 are nearly the same as those of the crystals grown through HVPE. This confirms that the platinum group-Group 13 metal alloy coating film reduces the contamination with Pt and Ir of the grown crystals. On the other hand, it is known that the crystals grown in Comparative Example 1 contaminated ten times more with Pt and Ir than the crystals grown through HVPE.

TABLE 2

| | Ir (counts/second) | Pt (counts/second) |
|---|---|---|
| Example 7 | 19.7 | 38.5 |
| Example 12 | 42.7 | 35.0 |
| Example 13 | 36.7 | 39.2 |
| Comparative Example 1 | 751 | 274 |
| HVPE (reference) | 14.5 | 20.2 |

INDUSTRIAL APPLICABILITY

The invention is useful for growth of bulky single crystals of nitride with Group 13 element of the Periodic Table, especially for the growth of bulky single crystals of GaN. According to the production method of the invention, the impurities derived from the reactor and the reactor members in the obtained crystals can be reduced, and further, the reactor having a stable surface can be used multiple times in crystal growth, and accordingly, the invention is expected to bring about significant improvements in both the time and the cost. Accordingly, the industrial applicability of the invention is extremely great.

While the present invention has been described in detail and with reference to specific embodiments thereof, it will be apparent to one skilled in the art that various changes and modifications can be made therein without departing from the spirit and scope thereof.

The present disclosure relates to the subject matter contained in U.S. Provisional Patent Application No. 61/427,403, filed Dec. 27, 2010, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for producing a semiconductor crystal, comprising:
    growing a crystal in the presence of a nitrogen-containing solvent and a mineralizer in a reactor; and
    coating at least a portion of an inner surface of the reactor and a surface of a member placed inside the reactor with a platinum group-Group 13 metal alloy coating film at a temperature of from 400 to 700° C. and under a pressure of from 80 to 700 MPa,
    wherein the member is placed inside the reactor such that the member is separable from the reactor.

2. The method for producing a semiconductor crystal of claim 1, wherein the platinum group-Group 13 metal alloy coating film comprises Ga as the Group 13 metal.

3. The method for producing a semiconductor crystal of claim 1, wherein the platinum group-Group 13 metal alloy coating film comprises Pt as the platinum group metal.

4. The method for producing a semiconductor crystal of claim 1, wherein the coating comprises coating at least 50% of a total area of the inner surface of the reactor and the surface of the member with the platinum group-Group 13 metal alloy coating film.

5. The method for producing a semiconductor crystal of claim 1, wherein the platinum group-Group 13 metal alloy coating is carried out simultaneously with at least a part of the growing of the crystal.

6. The method for producing a semiconductor crystal of claim 1, wherein the platinum group-Group 13 metal alloy coating film is a film that comprises at least one alloy selected from the group consisting of $Ga_3Pt_5$, $Ga_3Pt_2$, $GaPt$, $Ga_2Pt$, $GaPt_2$ and $GaPt_3$.

7. The method for producing a semiconductor crystal of claim 1, wherein the platinum group-Group 13 metal alloy coating film has a thickness of from 5 to 100 μm.

8. The method for producing a semiconductor crystal of claim 1, wherein at least one of the growing and the coating is carried out multiple times.

9. The method for producing a semiconductor crystal of claim 1, wherein the reactor and the member are formed of Pt or a Pt-containing alloy.

10. The method for producing a semiconductor crystal of claim 1, wherein the coating forms the platinum group-Group 13 metal alloy coating in the reactor in the presence of the nitrogen-containing solvent and a Group 13 metal therein, at a temperature of from 400 to 700° C. and under a pressure of from 100 to 700 MPa.

11. The method for producing a semiconductor crystal of claim 1, wherein the platinum group-Group 13 metal alloy coating film is polycrystalline.

* * * * *